(12) United States Patent
Lo et al.

(10) Patent No.: US 6,798,054 B1
(45) Date of Patent: Sep. 28, 2004

(54) METHOD OF PACKAGING MULTI CHIP MODULE

(75) Inventors: Randy H. Y. Lo, Taipei (TW); Chi-Chuan Wu, Tai-Chung (TW); Ssu-Cheng Lai, Tai-Chung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 09/627,979

(22) Filed: Jul. 28, 2000

(51) Int. Cl.$^7$ .......................... H01L 23/02; H01L 23/34
(52) U.S. Cl. .................. 257/685; 257/723; 257/778; 257/784; 257/787
(58) Field of Search ................. 257/685–686, 257/723, 778, 784, 773, 787, 790, 737, 738, 48, 208, 706–707, 777, 667, 668, 619–620, 688, 724, 779

(56) References Cited

U.S. PATENT DOCUMENTS

| | | | | |
|---|---|---|---|---|
| 5,648,661 A | * | 7/1997 | Rostoker et al. | |
| 5,784,264 A | * | 7/1998 | Tanioka | 361/803 |
| 5,994,166 A | * | 11/1999 | Akram et al. | |
| 6,064,111 A | * | 5/2000 | Sota et al. | 257/667 |
| 6,214,642 B1 | * | 4/2001 | Chen et al. | |
| 6,301,121 B1 | * | 10/2001 | Lin | 361/783 |
| 6,307,256 B1 | * | 10/2001 | Chiang et al. | 257/668 |
| 6,339,254 B1 | * | 1/2002 | Venkateshwaran et al. | |

* cited by examiner

Primary Examiner—Long Pham
Assistant Examiner—Dilinh Nguyen

(57) ABSTRACT

A method of packaging a multi chip module (MCM) with low cost and high reliability is disclosed. In the MCM process, a plurality of bare chips and CPSs, such as CPU or memory device, are integrated on a substrate to increase the package density. The method discards the high cost KGD process and directly takes the thin and small CSPs passing the tests as KGD and integrates the chips and CSPs into ball grid array package (BGA package) so that the cost is reduced and the yield and quality of the package is improved.

15 Claims, 6 Drawing Sheets

US 6,798,054 B1

METHOD OF PACKAGING MULTI CHIP MODULE

FIELD OF THE INVENTION

The present invention relates to a method or packaging an integrated circuit (IC) package, and particularly, to a low cost and high reliability method of packaging a plurality of bare chips and CSP(Chip Scale Package) on a substrate for a multi chip module package (MCM package) so as to increase the package density.

BACKGROUND OF THE INVENTION

In conventional semiconductor manufacture, a wafer which is well treated is cut into a plurality of chips, and fixed on a lead frame using gold (Au) wires to connect micro electrodes on the chip and pins of the lead frame. The above structure is then enclosed by suitable plastics to protect the internal semiconductor devices. The process to connect the chip to the lead frame and enclose the structure is referred to as packaging.

The present advanced package, such as CSP (chip scale package), becomes much smaller, lighter, thinner, and shorter compared with the conventional package, such as, QFP (Quad Flat Package) SOP (Small Outline Package) in order to reduce the cost. Meanwhile, ceramic packaging has been gradually replaced by plastic packaging. The reliability of the product is further enhanced by multi layer interconnect structure, protection layer process, and high quality of packaging. To further reduce the cost of packaging is greatly desired in the present IC industry. Therefore, advanced packaging such as CSP or wafer level CSP has been developed to increase the package density. MCM package is one of most promising techniques.

KGD is defined as a chip that meets the specification and passes the test without wiring. To increase the qualified ratio of a MCM package in the semiconductor process, it is desired to use KGD in packaging. However, the use of KGD increases the cost of packaging.

SUMMARY OF THE INVENTION

To overcome the above shortcoming in the conventional IC packaging, an object of the present invention is to provide a method of packaging MCM with CSPs as small and thin package bodies and integrating those bare chips and CSP into a ball grid array package (BGA package) to greatly reduce the cost because CSP test has advantages of easy test and low cost compared with conventional KGD test.

Another object of the present invention is to provide a MCM package structure of low cost and high reliability, which includes a substrate, one or more chip packages, a plurality of electrical connect pins, and a package material to enclose the substrate, the chips, and the chip package.

Other features and advantages of the invention will become apparent from the following description of the invention that refers to the accompanying drawings.

DETAILED DESCRIPTION OF THE PREFERRED EMBODIMENT

Figure 1A:
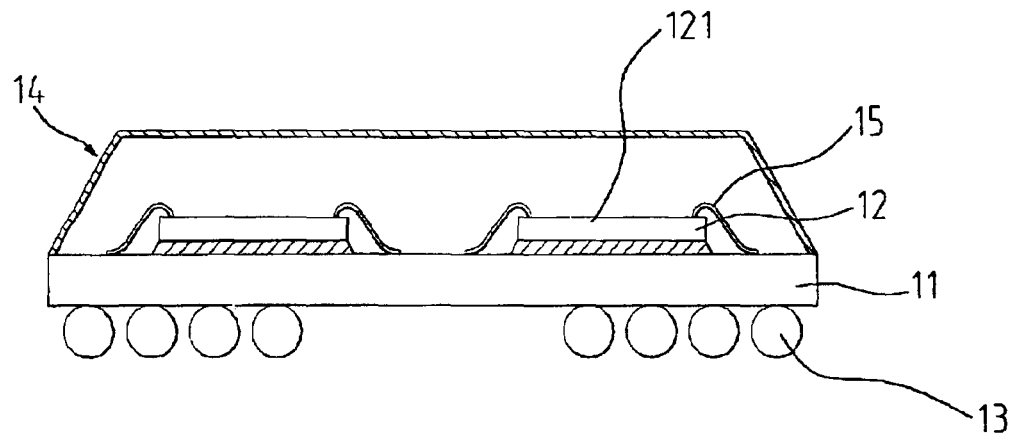
FIG. 1A is a schematic diagram of MCM package structure with wire bonding in the prior arts.
Figure 1B:
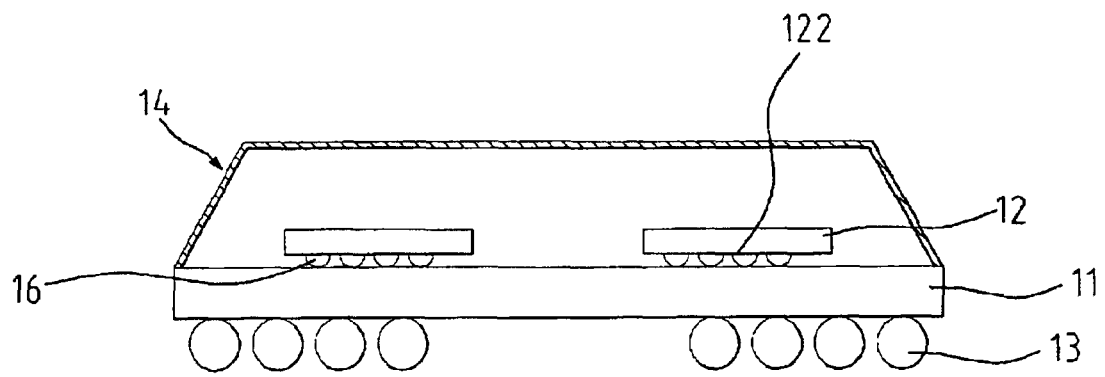
FIG. 1B is a schematic diagram of MCM package structure with flip chip bonding in the prior arts.

FIGS. 1A and 1B show the structure of a MCM package in the prior arts. The package body encloses a plurality of chips, which are interconnected by wire bonding or flip chip bonding. FIG. 1A schematically illustrates the package structure with wire bonding, which comprises a substrate 11, a plurality of chips 12, solder balls 13 under the substrate 11, wires 15 to connect the upper chip 121 and the substrate 11, and package mold resin 14. FIG. 1B schematically illustrates the package structure with flip chip bonding, which comprises a substrate 11, a plurality of chips 12, solder balls 13 under the substrate 11, ball bumps 16 to connect the lower chip 122 and the substrate 11, and package mold resin 14. Since the chips enclosed within the package are not examined by burn-in test and function test (F/T), the yield of the chips are not determined before packaging, and the yield of the package body after packaging can not be promoted. If four chips are enclosed within the package body and each chip has an average F/T yield 99%, the yield of the package is (99%)X(99%)X(99%)X(99%)=96%.

Therefore, the F/T yield of the whole MCM package reduces to 96%, after packaging the four chips. The more the chips packaged in the package, the less the yield. It is disadvantageous for the conventional MCM package to be used in advanced IC packaging in the future.

In the prior arts, one solution to overcoming the above disadvantage is to provide KGD. To prevent the F/T yield of the package from decreasing due to undetermined yield of the chips, both burn-in test and function test are needed for the chips, which will be packaged in subsequent packaging process. Those chips that pass through the above tests are called 'known-good dies', abbreviated as "KGDs". However, the KGD process imposes high cost because the size of the chip is very small and not easily fixed during burn-in test and function test.

Figure 2A:
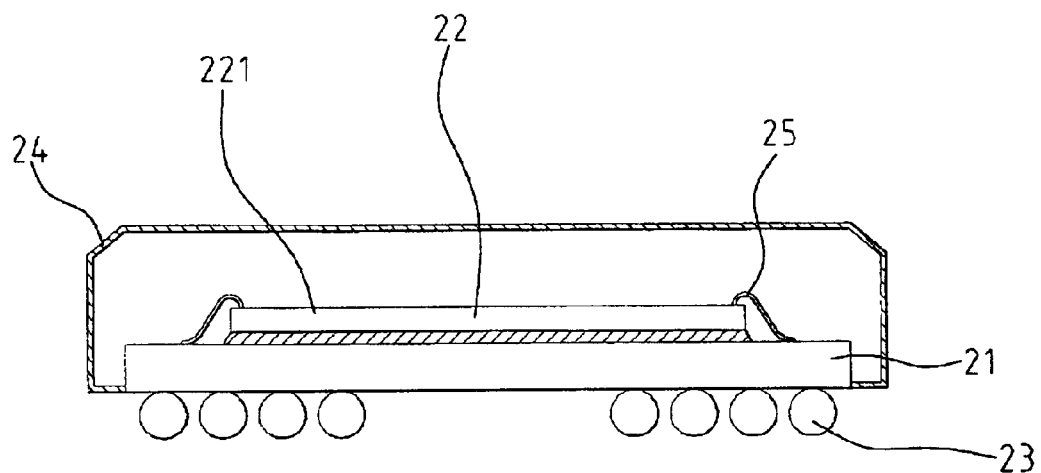
FIG. 2A is a schematic diagram of CSP package structure with wire bonding in the prior arts.
Figure 2B:
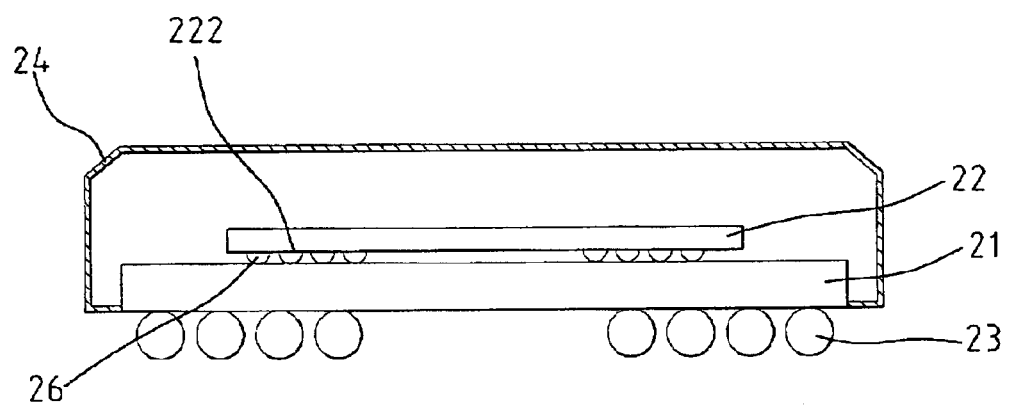
FIG. 2B is a schematic diagram of CSP package structure with flip chip bonding in the prior arts.
Figure 2C:
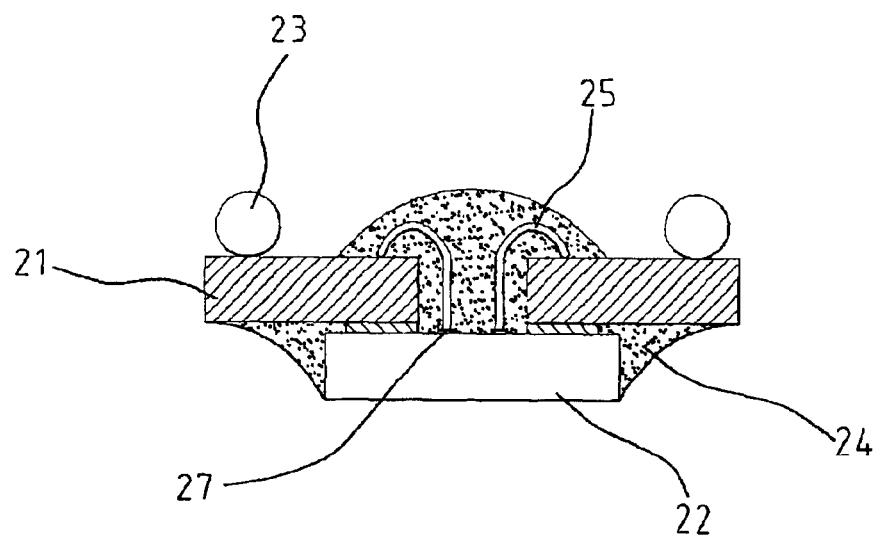
FIG. 2C is a schematic diagram of another CSP package structure with a central pad bonding in the prior arts.
Figure 2D:
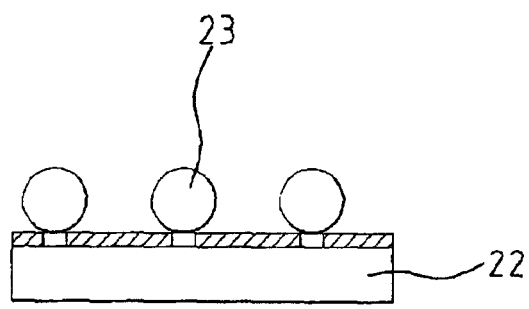
FIG. 2D is a schematic diagram of wafer level CSP package in the prior arts.

The present invention provides an improved chip packaging method. FIGS. 2A–2D show CSP package structure in the prior arts. CSP is referred to the package that has a size just a little bigger than the chip and has a height less than 1.00 mm. FIG. 2A is a schematic diagram of CSP package structure with wire bonding in the prior arts, FIG. 2B is a schematic diagram of CSP package structure with flip chip bonding in the prior arts, FIG. 2C is a schematic diagram of another CSP package structure with a central pad bonding in the prior arts, and FIG. 2D is a schematic diagram of wafer level CSP in the prior arts. The CSP is not only light, thin, short, and small, but also passes through burn-in test and function test so that the yield of the CSP is not an issue. It is important that the cost of burn-in test and function test of CSP process is much lower than that of the KGD process. Another aspect is that CSP has no yield issue and can easily replace KGD process for integration into a MCM package because of light, thin, short, and small size.

The present invention presents an MCM package structure in which at least one CSP is packaged along with another CSP or a bare die. In other words, there are two levels of packaged structures in the MCM package. The conventional CSP forms the first level of the packaged structure and the MCM forms the second level of the packaged structure. As shown in FIG. 2A, a conventional CSP 221 has a bare die 22 embedded and disposed above a CSP substrate 21, wires 25 for connecting the bare die 22 to the substrate 21, solder balls for connecting the CSP to external circuits, and package mold resin 24 enclosing the CSP. The CSP 222 shown in FIG. 2B has a structure similar to that of FIG. 2A except that ball bumps 26 instead of wires are used to connect the bare die 22 to the substrate 21. According to this invention, a bare die 22 is embedded and packaged above a CSP substrate 21 within a conventional CSP, and the conventional CSP is embedded and disposed above an MCM substrate 31 within an MCM package structure as shown in FIGS. 3A–3F.

Therefore, thin and small CSP or wafer level CSP after testing is served as KGD, which may include bare chips. Those bare chips can connect to the substrate by wire bonding or flip chip bonding, and the chips and CSP are further integrated into a ball grid array package (BGA package) so as to achieve the requirement of low cost and high quality for the MCM process.

THE FIRST EMBODIMENT

Figure 3A:
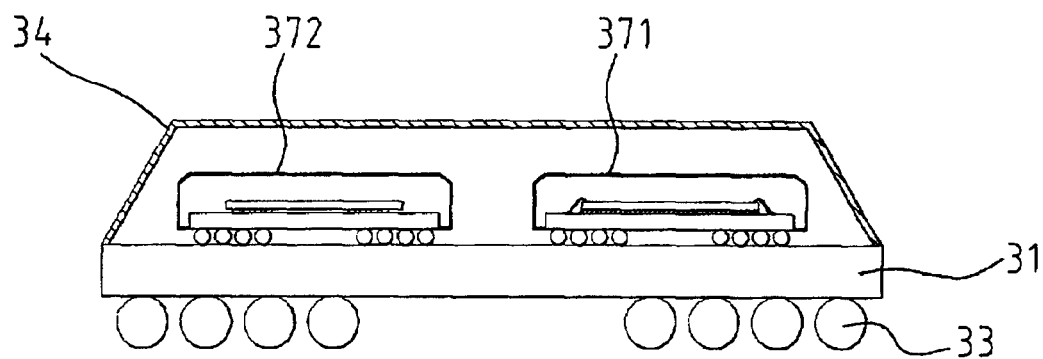
FIG. 3A is a schematic diagram of the first embodiment of MCM package structure in the present invention, illustrating a CSP package with wire bonding and a CSP package with flip chip bonding.

FIG. 3A illustrates the first embodiment of MCM package structure in the present invention which includes CSP packages with wire bonding and flip chip bonding. The CSP is integrated into MCM package process, and includes a substrate 31, solder balls 33 under the substrate 31, package mold resin 34, the CSP body 371 with wire bonding and is electrically connected to the substrate 31, and the CSP 372 with flip chip bonding is electrically connected to the substrate 31.

THE SECOND EMBODIMENT

Figure 3B:
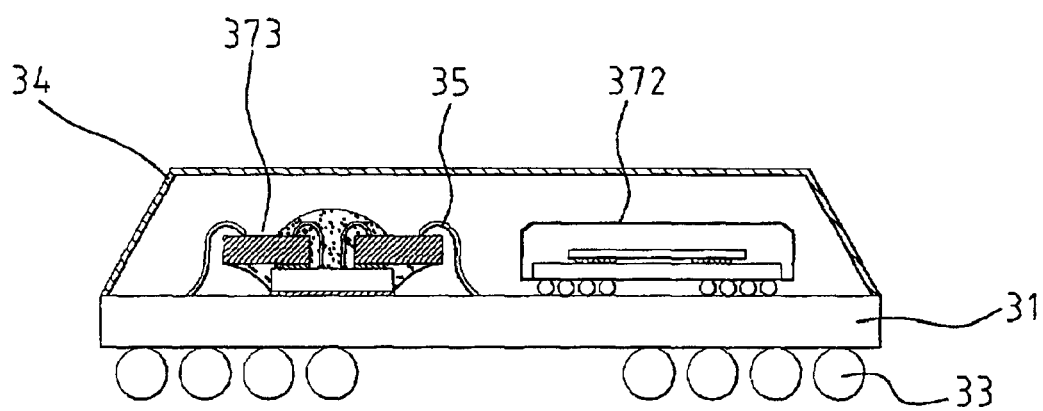
FIG. 3B is a schematic diagram of the second embodiment of MCM package structure in the present invention, illustrating a CSP package with flip chip bonding and a CSP package with a central pad bonding.

FIG. 3B illustrates the second embodiment of MCM package structure in the present invention which includes CSP packages with flip chip bonding and central pad bonding. The MCM package includes a substrate 31, solder balls 33 under the substrate 31, package mold resin 34, the CSP 372 is electrically connected to the substrate 31, and the CSP 373 is electrically connected to the substrate 31 by the wire 35.

THE THIRD EMBODIMENT

Figure 3C:
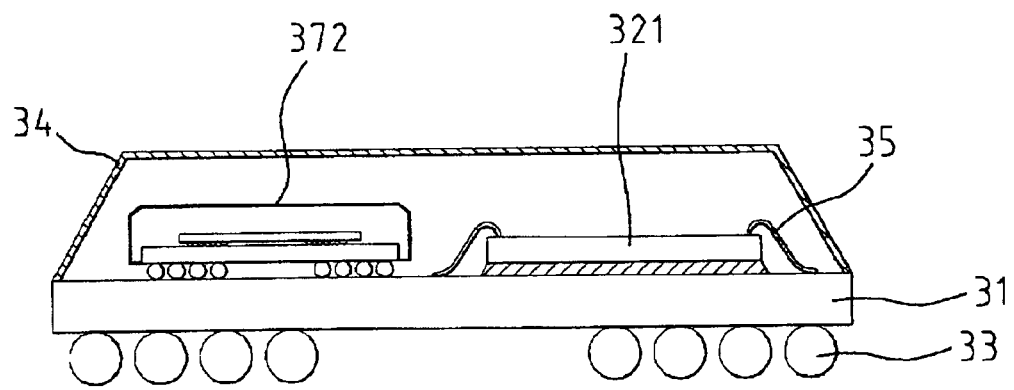
FIG. 3C is a schematic diagram of the third embodiment of MCM package structure in the present invention, illustrating a bare chip with wire bonding and a CSP package with flip chip bonding.
Figure 3D:
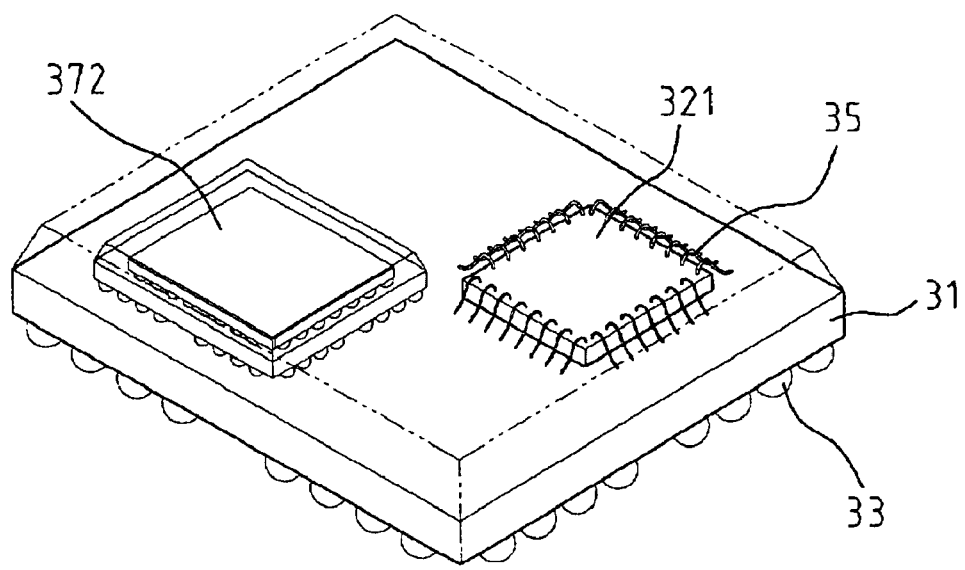
FIG. 3D is a perspective view of the third embodiment of MCM package structure in the present invention.

FIG. 3C illustrates the third embodiment or MCM package structure in the present invention which includes a bare chip and a CSP package with flip chip bonding. The MCM package includes a substrate 31, solder balls 33 under the substrate 31, package mold resin 34, the CSP body 377 is electrically connected to the substrate 31, and the bare chip 321 is electrically connected to the substrate 31 by the wire 35. FIG. 3D is a perspective view of the third embodiment of the MCM package structure in the present invention.

THE FOURTH EMBODIMENT

Figure 3E:
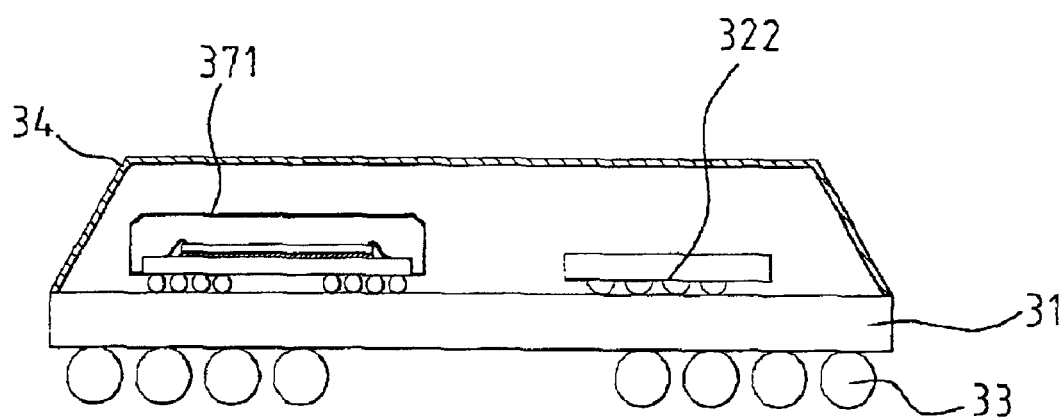
FIG. 3E is a schematic diagram of the fourth embodiment of MCM package structure in the present invention, illustrating a CSP package with wire bonding and a bare chip with flip chip bonding.

FIG. 3E illustrates the fourth embodiment of MCM package structure in the present invention which includes a bare chip and a CSP package with wire bonding. The MCM package includes a substrate 31, solder balls 33 under the substrate 31, package mold resin 34, the CSP body 371 is electrically connected to the substrate 31, and the bare chip 322 is electrically connected to the substrate 31 by means of flip-chip bonding.

THE FIFTH EMBODIMENT

Figure 3F:
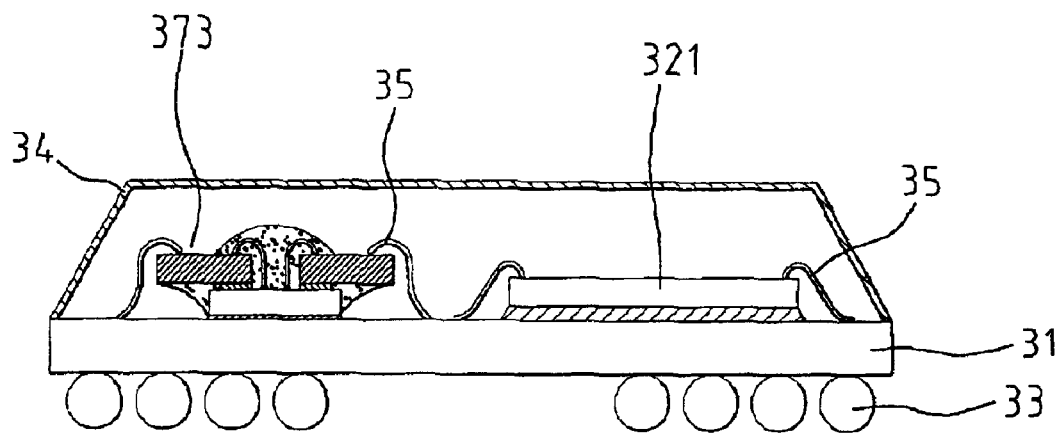
FIG. 3F is a schematic diagram of the fifth embodiment of MCM package structure in the present invention, illustrating a CSP package with a central pad bonding and a bare chip with wire bonding.

FIG. 3F illustrates the fifth embodiment of MCM package structure in the present invention which includes a bare chip and a CSP 373 package with a central pad bonding. The MCM package includes a substrate 31, solder balls 33 under the substrate 31, package mold resin 34, the CSP 373 with a central pad bonding is electrically connected to the substrate 31 by the wires 35, and the bare chip 321 is electrically connected to the substrate 31 by the wires 35.

Although only the preferred embodiments of this invention were shown and described in the above description, it is requested that any modification or combination that comes within the spirit of this invention be protected.

What is claimed is:

1. A multi-chip module package structure comprising:
   a multi-chip module substrate;
   at least two chip packages, each of said chip packages being a packaged chip module having a bare chip and a chip substrate packaged and enclosed therein, said at least two chip packages having been burn-in tested and function tested;
   a plurality of electrical connect points electrically connecting said chip packages with said multi-chip module substrate;
   a plurality of electrical connect pins; and
   a package material enclosing said multi-chip module substrate, said connect points and said chip packages;
   wherein said multi-chip module package structure is a ball grid array package.

2. The multi-chip module package structure as claimed in claim 1, wherein each of said chip packages is a chip-scale package or a wafer level chip-scale package.

3. The multi-chip module package structure as claimed in claim 1, wherein at least one of said chip packages is a chip-scale package with wire bonding.

4. The multi-chip module package structure as claimed in claim 1, wherein at least one of said chip packages is a chip-scale package with flip chip bonding.

5. The multi-chip module package structure as claimed in claim 1, wherein at least one of said chip packages is a chip-scale package with central pad bonding.

6. The multi-chip module package structure as claimed in claim 1, wherein said plurality of electrical connect pins are solder balls.

7. The multi-chip module package structure as claimed in claim 1, wherein said plurality of electrical connect points are solder balls or gold wires.

8. A multi-chip module package structure comprising:
a multi-chip module substrate;
at least a bare chip;
at least one chip package being a packaged chip module having a bare chip and a chip substrate packaged and enclosed therein, said at least one chip package having been burn-in tested and function tested;
a plurality of electrical connect points electrically connecting said bare chip and said at least one chip package with said multi-chip module substrate;
a plurality of electrical connect pins; and
a package material enclosing said multi-chip module substrate, said connect points, said bare chip and said at least one chip package;
wherein said multi-chip module package structure is a ball grid array package.

9. The multi-chip module package structure as claimed in claim 8, wherein said bare chip is bonded to said multi-chip module substrate by wire bonding or flip chip bonding.

10. The multi-chip module package structure as claimed in claim 8, wherein said at least one chip package is a chip-scale package or a wafer level chip-scale package.

11. The multi-chip module package structure as claimed in claim 8, wherein said at least one chip package is a chip-scale package with wire bonding.

12. The multi-chip module package structure as claimed in claim 8, wherein said at least one chip package is a chip-scale package with flip chip bonding.

13. The multi-chip module package structure as claimed in claim 8, wherein said at least one chip package is a chip-scale package with central pad bonding.

14. The multi-chip module package structure as claimed in claim 8, wherein said plurality of electrical connect pins are solder balls.

15. The multi-chip module package structure as claimed in claim 8, wherein said plurality of electrical connect points are solder balls or gold wires.

* * * * *